(12) United States Patent
Brox et al.

(10) Patent No.: US 7,317,657 B2
(45) Date of Patent: Jan. 8, 2008

(54) SEMICONDUCTOR MEMORY DEVICE, SYSTEM WITH SEMICONDUCTOR MEMORY DEVICE, AND METHOD FOR OPERATING A SEMICONDUCTOR MEMORY DEVICE

(75) Inventors: Martin Brox, München (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/319,754

(22) Filed: Dec. 29, 2005

(65) Prior Publication Data

US 2006/0158954 A1    Jul. 20, 2006

(30) Foreign Application Priority Data

Dec. 30, 2004    (DE) .................... 10 2004 063 531

(51) Int. Cl.
*G11C 8/00*    (2006.01)
(52) U.S. Cl. .............. 365/233; 365/189.05; 365/189.09
(58) Field of Classification Search .............. 365/233, 365/189.05, 189.09
See application file for complete search history.

(56) References Cited

U.S. PATENT DOCUMENTS

| 6,385,100 | B2 | 5/2002 | Noda |
| 6,483,769 | B2 | 11/2002 | La |
| 6,675,304 | B1 * | 1/2004 | Pole et al. .................. 713/322 |
| 2004/0042255 | A1 * | 3/2004 | Labrum et al. ............. 365/149 |

OTHER PUBLICATIONS

Jung, Y. et al. (2001). "A Dual-Loop Delay-Locked Loop Using Multiple Voltage-Controlled Delay Lines," *IEEE Journal of Solid-State Circuits* 36(5):784-791.

* cited by examiner

*Primary Examiner*—Huan Hoang
(74) *Attorney, Agent, or Firm*—Slater & Matsil, L.L.P.

(57) ABSTRACT

The invention relates to a semiconductor memory device, a system with a semiconductor memory device, and a method for operating a semiconductor memory device, comprising the steps of reading out a data value, in particular a CAS latency time data value (CL) stored in a memory; activating or deactivating a device provided on said semiconductor memory device in support of a high speed operation, as a function of the data value (CL) stored.

13 Claims, 5 Drawing Sheets

SEMICONDUCTOR MEMORY DEVICE, SYSTEM WITH SEMICONDUCTOR MEMORY DEVICE, AND METHOD FOR OPERATING A SEMICONDUCTOR MEMORY DEVICE

CLAIM FOR PRIORITY

This application claims the benefit of priority to German Application No. 10 2004 063 531.5, filed in the German language on Dec. 30, 2004, the contents of which are hereby incorporated by reference.

TECHNICAL FIELD OF THE INVENTION

The invention relates to a method for operating a semiconductor memory device, and to a semiconductor memory device, as well as to a system with a semiconductor memory device.

BACKGROUND OF THE INVENTION

In the case of semiconductor memory devices, one differentiates between so-called functional memory devices (e.g. PLAs, PALs, etc.), and so-called table memory devices, e.g. ROM devices (ROM=Read Only Memory) and RAM devices (RAM=Random Access Memory or read-write memory).

A RAM device is a memory for storing data under a predetermined address and for reading out the data under this address later.

The corresponding address may be input into the RAM device via so-called address input pins; for the input and output of the data, a plurality of, e.g. 16, so-called data input/output pins (I/Os or Input/Outputs) are provided. By applying an appropriate signal (e.g. a read/write signal) at a write/read selection pin it may be selected whether data are to be stored or to be read out (at the moment).

Since it is intended to accommodate as many memory cells as possible in one RAM device, one has been trying to realize them as simple as possible. In the case of so-called SRAMs (SRAM=Static Random Access Memory), the individual memory cells consist e.g. of few, for instance 6, transistors, and in the case of so-called DRAMs (DRAM=Dynamic Random Access Memory) in general only of one single, correspondingly controlled capacitor with the capacitance of which one bit each can be stored as charge. This charge, however, remains for a short time only. Therefore, a so-called "refresh" must be performed regularly, e.g. approximately every 64 ms.

For technological reasons, the individual memory cells are, in the case of memory devices, in particular DRAM devices, arranged side by side in a plurality of rows and columns in a rectangular matrix or a rectangular array, respectively.

In order to achieve a correspondingly high overall storage capacity and/or a data read or write rate that is as high as possible, a plurality of, e.g. four—substantially rectangular—(sub) arrays may be provided in an individual RAM device or chip ("multi-bank chip") instead of one single array.

To perform a write or read access, a particular, predetermined sequence of commands has to be run through:

By means of a word line activate command (activate command (ACT)), a corresponding word line—that is, in particular, assigned to a particular subarray ("memory bank")—(and that is defined by the row address ("row address")) is, for instance, activated first of all.

Subsequently—by means of a corresponding read or write command (Read (RD) or Write (WT) command)—it is initiated that the corresponding data—that are then exactly specified by the corresponding column address ("column address")—are correspondingly output (or read in).

Next—by means of a word line deactivate command (e.g. a precharge command (PRE command))—the corresponding word line is deactivated again, and the corresponding subarray ("memory bank") is prepared for the next word line activate command (activate command (ACT)).

To guarantee a faultless operation of the DRAM device, particular time conditions have to be met.

For instance, a particular time interval tRCD must lie between the word line activate command (ACT command) and a corresponding read (or write) command (RD (or WT) command). This delay results, for instance, from the time required by the sense amplifiers for amplifying the data supplied by the memory cells addressed by the word line.

Similarly, a particular time interval also has to lie e.g. between the read (or write) command (RD (or WT) command) and the outputting (or inputting) of the data at corresponding data pins of the DRAM device (so-called CAS latency or Column Address Strobe latency, respectively).

Furthermore, an appropriate time interval tRP (so-called "row precharge time" delay) must also be kept correspondingly between the read (or write) command (RD (or WT) command) and a subsequent word line deactivate command (PRE command).

The size CL of the respective, above-mentioned CAS latency (Column Address Strobe latency)—or a value CL indicating the number of clocks passing between the read command and the valid data output—may be programmed in a register provided on the DRAM device (wherein there may e.g. apply: CL=2, 3, 4, or 5, etc.).

If, in a corresponding DRAM device, circuits are used that improve the high frequency behavior (e.g. appropriate duty cycle correction circuits (cf. e.g. IEEE Journal of Solid-State Circuits, vol. 36, pages 784-791, May 2001)), the corresponding device may be operated at higher clock frequency than in normal operation ("high performance operation").

The CL value stored in the above-mentioned CAS latency register is then re-programmed correspondingly (so that a correspondingly different CL value is stored in the CAS latency register in high performance operation than in normal operation).

The use of the above-mentioned duty cycle correction circuit, however, results in a correspondingly high additional electric power consumption caused by the correction circuit. This is not acceptable for many applications.

SUMMARY OF THE INVENTION

It is an object of the invention to provide a novel method for operating a semiconductor memory device, as well as a novel semiconductor device and a novel system with a semiconductor memory device.

This and further objects are achieved by the subject matters of claims 1, 12, and 13.

Advantageous further developments of the invention are indicated in the subclaims.

In accordance with an aspect of the invention, there is provided a method for operating a semiconductor memory device, comprising the steps of:

reading out a data value (CL) stored in a memory;
activating or deactivating a device provided on the semiconductor memory device in support of a high speed operation, as a function of the stored data value (CL).

It is of advantage if the memory is a latency time register, in particular a CAS latency time register, and the data value stored in the memory is a latency time data value, in particular a CAS latency time data value (CL).

In an advantageous embodiment of the invention, the device is activated if the data value stored in the memory is greater than or greater than-equal to a predetermined threshold value ($CL_{activate}$).

The above-mentioned device for supporting a memory device high speed operation may e.g. be a duty cycle correction circuit, or e.g. a voltage regulation circuit, or part of a voltage regulation circuit, or e.g. a receiver circuit, or part of a receiver circuit, or e.g. an output driver circuit, or part of an output driver circuit, etc., etc.

BRIEF DESCRIPTION OF THE DRAWINGS

In the following, the invention will be explained in more detail by means of an embodiment and the enclosed drawing. The drawing shows.

DETAILED DESCRIPTION OF THE INVENTION

Figure 1:
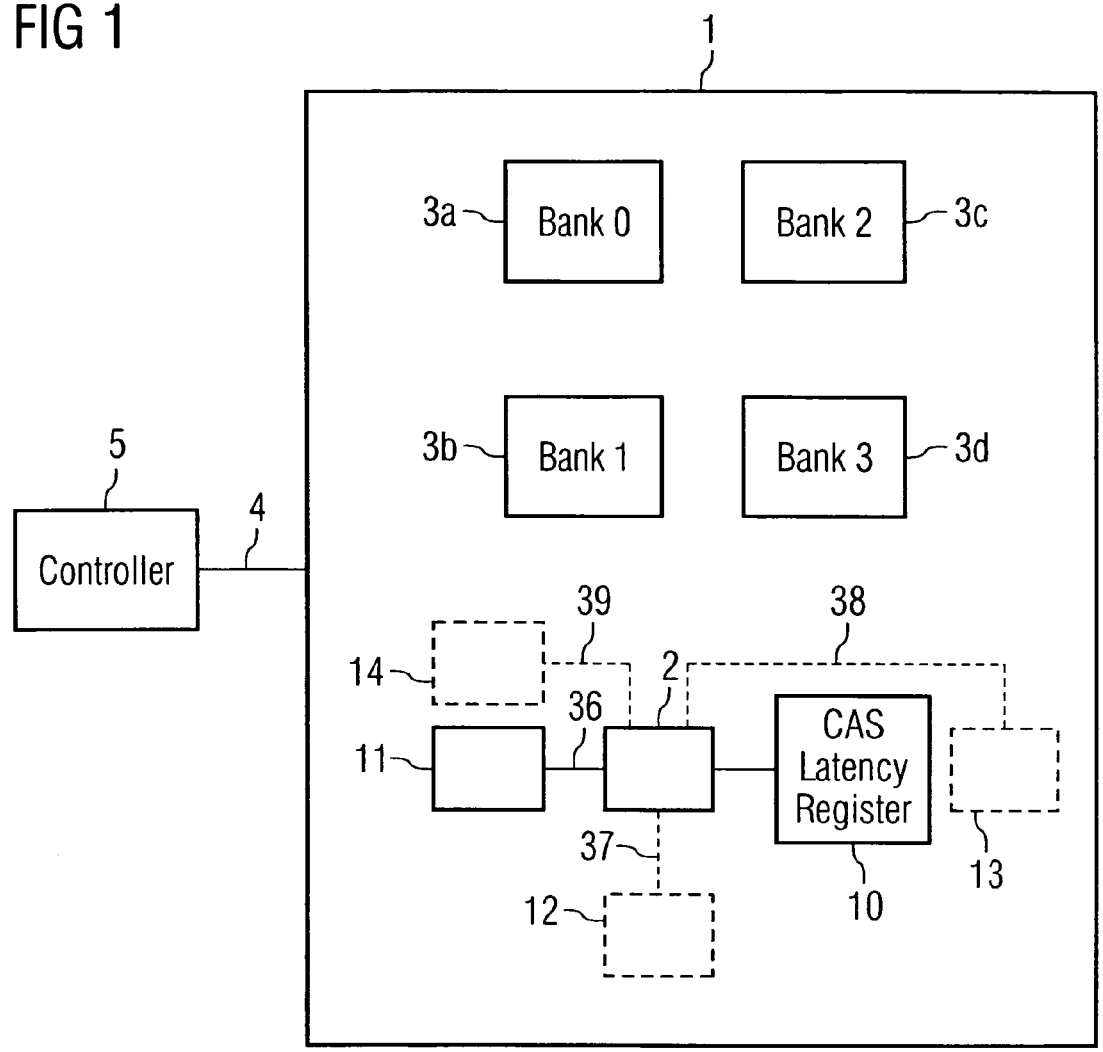
FIG. 1 a schematic representation of the structure of a semiconductor memory device comprising a plurality of subarrays, as well as a memory device controller according to an embodiment of the present invention.

FIG. 1 shows a schematic representation of the structure of a semiconductor memory device 1 or semiconductor memory chip, respectively, and of a—central—memory device controller 5 according to an embodiment of the present invention.

The semiconductor memory device 1 may, for instance, be a table memory device based on CMOS technology, e.g. a RAM memory device (RAM=Random Access Memory or read-write memory), in particular a SRAM memory device (SRAM=Static Random Access Memory) or a DRAM memory device (DRAM=Dynamic Random Access Memory or dynamic read-write memory) (e.g. a DDR-DRAM (DDR-DRAM=Double Data Rate DRAM).

In the semiconductor memory device 1, data may—after the input of a corresponding address—be stored under the respective address and be read out again under this address later.

The address may be input in several, e.g. two successive steps (e.g. first a row address ("row address")—and possibly parts of a column address ("column address")—, and then the column address ("column address") (or the remaining parts of the column address ("column address")), etc.).

By applying an appropriate control signal (e.g. a read/write signal) there may be selected whether data are to be stored or to be read out.

The data input into the semiconductor memory device 1 are stored in corresponding memory cells there and are read out again from the corresponding memory cells later.

Each memory cell consists e.g. of few elements, in particular of only one single, correspondingly controlled capacitor with the capacitance of which one bit each can be stored as charge.

As results from FIG. 1, a particular number of memory cells each is positioned—side by side in a plurality of rows and columns—in a rectangular or square subarray ("memory bank") 3a, 3b, 3c, 3d, so that—corresponding to the number of memory cells contained—e.g. 32 MBit, 64 MBit, 128 MBit, 256 MBit, etc. each can be stored in a subarray 3a, 3b, 3c, 3d.

As is further illustrated in FIG. 1, the semiconductor memory device 1 comprises a plurality of, e.g. four, memory cell subarrays 3a, 3b, 3c, 3d (here: the memory banks 0-3) that are each of substantially identical structure, are distributed evenly over the area of the device, and are controlled by the above-mentioned memory device controller 5 substantially independently of each other, so that a total storage capacity of e.g. 128 MBit, 256 MBit, 512 MBit, or 1024 MBit (or 1 GBit) results for the semiconductor memory device 1.

The above-mentioned address (input into the semiconductor memory device 1 or the memory device controller 5, respectively) comprises a corresponding number of (here e.g. two) bits ("subarray selection bits") serving to address the respectively desired subarray 3a, 3b, 3c, 3d during the storing or reading out of data.

By the providing of a plurality of substantially independent subarrays 3a, 3b, 3c, 3d it can be achieved that—in parallel or overlapping in time—corresponding write or read accesses may be performed in several, different subarrays 3a, 3b, 3c, 3d.

The—central—memory device controller 5 ("memory controller") may—as is illustrated by way of example in FIG. 1—be designed as a separate semiconductor device communicating with the DRAM semiconductor memory device 1 via external pins.

Alternatively, the memory device controller 5 may, for instance, also be arranged on one and the same chip 1 as the above-mentioned memory cell subarrays 3a, 3b, 3c, 3d (memory banks 0-3).

To perform a write or read access, a particular, predetermined sequence of commands is run through in the embodiment illustrated here:

First—by means of a word line activate command (activate command (ACT))—a corresponding word line or row of memory cells, respectively—assigned to a particular subarray 3a, 3b, 3c, 3d predetermined by the above-mentioned address (in particular the above-mentioned "subarray selection bits")—is activated.

To this end, the memory device controller 5 sends a corresponding word line activate command signal (ACT command signal) via a corresponding bus system 4.

Subsequently (correspondingly similar as with conventional DRAM memory devices) it is initiated that the data values stored in the memory cells arranged in the respective row defined by the respective row address ("row address") are read out by the sense amplifiers assigned to the corresponding word line.

Next—after receipt of a corresponding read or write command signal (Read (RD) or Write (WT) command signal) sent by the memory device controller 5—it is initiated by the corresponding subarray controller 6a, 6b, 6c, 6d that the corresponding data—that are then exactly specified by the corresponding column address ("column address") are correspondingly output (or read into the corresponding memory cell(s)) (e.g. by the corresponding sense amplifier(s)).

The memory device controller 5 may then (correspondingly similar as with conventional DRAM memory devices) first of all leave the respective word line—activated by the above-mentioned ACT command signal—of the corresponding subarray 3a, 3b, 3c, 3d in the above-mentioned activated state (i.e. first of all not yet send a corresponding word line deactivate command signal (precharge or PRE command signal) to the corresponding subarray 3a, 3b, 3c, 3d). This is only done if, in the corresponding subarray 3a, 3b, 3c, 3d, a word line different from the one that is (still) in the activated state is to be accessed.

To guarantee a faultless operation of the semiconductor memory device 1, particular time conditions have to be observed.

For instance, a particular time interval tRCD has to lie between the word line activate command (ACT command) and a corresponding read (or write) command (RD (or WT) command). This delay results e.g. from the time required by the sense amplifiers for amplifying the data supplied by the memory cells addressed by the word line.

Similarly, a particular time interval also has to lie e.g. between the read (or write) command (RD (or WT) command) and the outputting (or inputting) of the data at corresponding data pins of the semiconductor memory device 1 (so-called CAS latency or Column Address Strobe latency).

Furthermore, a corresponding time interval tRP (so-called "row precharge time" delay) also must be kept correspondingly between the read (or write) command (RD (or WT) command) and a subsequent word line deactivate command (PRE command).

The size CL of the respective CAS latency (Column Address Strobe latency)—or a value CL indicating the number of clocks passing between the read command and the valid data output—is programmed in a register 10 provided on the semiconductor memory device 1 (wherein there may e.g. apply: CL=2, 3, 4, or 5, etc.).

Figure 2:
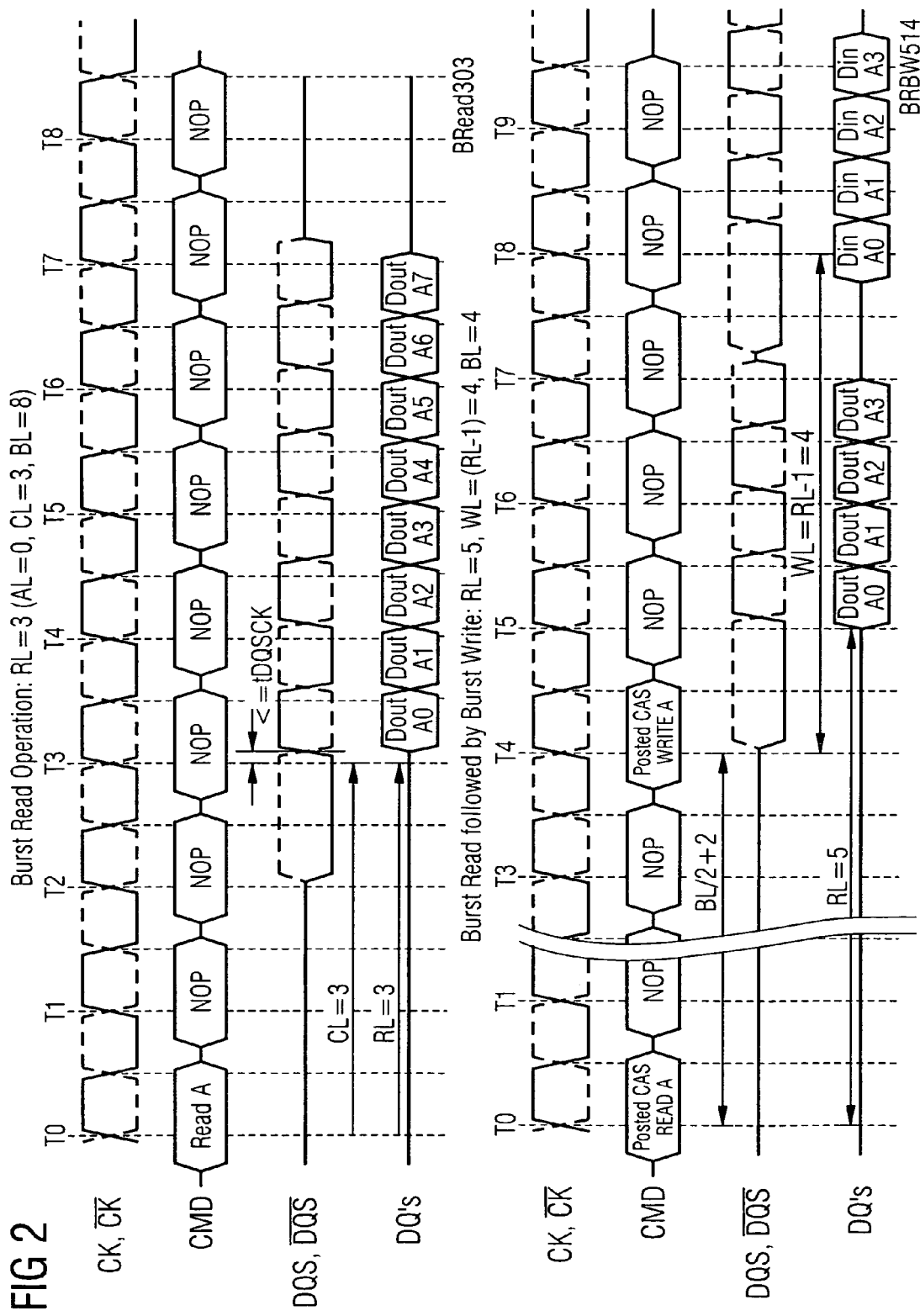
FIG. 2 a schematic timing diagram of signals used during the reading or writing of data out of or into the semiconductor memory device illustrated in FIG. 1.

For a more detailed illustration of the CAS latency occurring with the semiconductor memory device 1 (here: at a CAS latency value CL=3 stored in the CAS latency register 10), a timing diagram of signals used during the reading or writing of data out of or into the semiconductor memory device 1 illustrated in FIG. 1 is shown by way of example in FIG. 2 (here: at a burst-read operation and a burst-write operation following the burst-read operation).

"CK" stands for an external clock signal that is present at a clock pin of the semiconductor memory device 1 (and "/CK" for an inverse, external clock signal that is present at an inverse clock pin of the semiconductor memory device 1), "DQ" stands for data signals that are present at the data pins of the semiconductor memory device 1, CMD for control signals that present at corresponding control pins of the semiconductor memory device 1 (e.g. RD or READ, WT or WRITE, etc.), and "DQS" for a clock signal that is generated internally in the semiconductor memory device from the external clock signal CK (and "/DQS" for an internal clock signal inverse thereto).

As results from FIG. 2, a particular time interval— determined by the CAS latency value CL (and defined by the number of clocks predetermined by the clock signal CK (here: CL=3) lies between a read command (RD or READ command (here e.g.: a "READ A" command)) and the outputting of the corresponding data at the corresponding data pins of the semiconductor memory device 1 (here e.g. the data Dout A0, etc.).

As results from FIG. 1—as compared to a standard or normal version for the semiconductor memory device—one or a plurality of high speed supplement devices 11, 12, 13, 14, etc. improving the high frequency behavior may optionally additionally be provided in the semiconductor memory device 1 (e.g. the high speed supplement device 11, and/or the high speed supplement device 12, and/or the high speed supplement device 13, and/or the high speed supplement device 14, etc.), or—in particular in the standard or normal version of the semiconductor memory device 1—no such supplement device.

In particular if one or a plurality of high speed supplement devices 11, 12, 13, 14, etc. improving the high frequency behavior are provided in the semiconductor memory device 1 (or, alternatively, also if no such devices are provided), the corresponding semiconductor memory device 1 may be operated at higher clock frequencies $f_{high}$ than in normal operation ("high performance operation") (in particular at correspondingly higher frequencies $f_{high}$ of the external and/or internal clock signal CK, /CK, DQS, /DQS than provided for normal operation).

Instead, the semiconductor memory device 1 may alternatively also be operated with the relatively low clock frequency $f_{normal}$ provided for normal operation even if one or a plurality of high speed supplement devices 11, 12, 13, 14, etc. improving the high frequency behavior are provided (and/or if—as in the normal case—no such devices are provided) (in particular at the frequency $f_{normal}$ of the external and/or internal clock signal CK, /CK, DQS, /DQS provided for normal operation).

In particular if the semiconductor memory device 1 is to be operated at—vis-á-vis the normal operation—higher clock frequencies $f_{high}$ ("high performance operation"), the CL value stored in the CAS latency register 10 can be reprogrammed correspondingly (so that a correspondingly different CL value is stored in the CAS latency register in high performance operation than in normal operation).

For instance, a CAS latency value CL of e.g. 2, 3, or 4 may be stored in the CAS latency register 10 for normal operation, and a CAS latency value CL of e.g. 5 for high performance operation.

As results from FIG. 1, a controller 2 may be provided on the semiconductor memory device 1 (or, alternatively, e.g. also on the (external) memory device controller 5 ("controller"), by means of which the CAS latency value CL stored in the CAS latency register 10 is—e.g. during powering-up of the semiconductor memory device 1 (and/or—also after powering-up—(e.g. at regular time intervals))—read out and compared with a predetermined high speed supplement device activate CAS latency threshold value $CL_{activate}$ stored in the controller 2 (here: e.g. with a threshold value $CL_{activate}=4$).

If the CAS latency value CL stored in the CAS latency register 10 is greater than the high speed supplement device activate CAS latency threshold value $CL_{activate}$ (e.g. with CL=5 and $CL_{activate}=4$) the controller 2 automatically takes all the high speed supplement devices 11, 12, 13, 14 provided on the semiconductor memory device 1 (e.g. the high speed supplement device 11, and/or the high speed supplement device 12, and/or the high speed supplement device 13, and/or the high speed supplement device 14, etc.)—if available—to an active state or switches them on, respectively, and connects them to the current supply.

To this end, the controller 2 applies corresponding activate signals at corresponding control lines 36, 37, 38, 39 that are connected with the corresponding high speed supplement devices 11, 12, 13, 14 (and the corresponding devices 11, 12, 13, 14 are taken to an activated state in reaction thereto).

Otherwise—i.e. if the CAS latency value CL stored in the CAS latency register 10 is smaller than-equal to the high speed supplement device activate CAS latency threshold value $CL_{activate}$ (e.g. with CL=2, 3, or 4 and $CL_{activate}=4$)—, the controller 2 automatically takes all the high speed supplement devices 11, 12, 13, 14 provided on the semiconductor memory device 1 (e.g. the high speed supplement device 11, and/or the high speed supplement device 12, and/or the high speed supplement device 13, and/or the high speed supplement device 14, etc.)—if available—to an inactive state or switches them off, respectively (or leaves them in such a state), and disconnects them from the current supply.

To this end, corresponding deactivate signals may be applied by the controller 2 at the corresponding control lines 36, 37, 38, 39 and be transmitted to the corresponding high speed supplement devices 11, 12, 13, 14 (and the corresponding device 11, 12, 13, 14 may correspondingly be taken to a deactivated state in reaction thereto).

Thus, it can be achieved that, only if the semiconductor memory device 1 is actually operated in high performance operation, or—in particular—the CL value stored in the CAS latency register 10 has the corresponding values, the high speed supplement devices 11, 12, 13, 14 are activated and lead to a corresponding, additional electric power consumption that is to be attributed to the high speed supplement devices 11, 12, 13, 14. Otherwise, the high speed supplement devices 11, 12, 13, 14 are or remain deactivated, whereby the electric power consumption of the semiconductor memory device 1 can be reduced correspondingly (in particular an electric power consumption that is to be attributed to the high speed supplement devices 11, 12, 13, 14 can be avoided).

Figure 3:
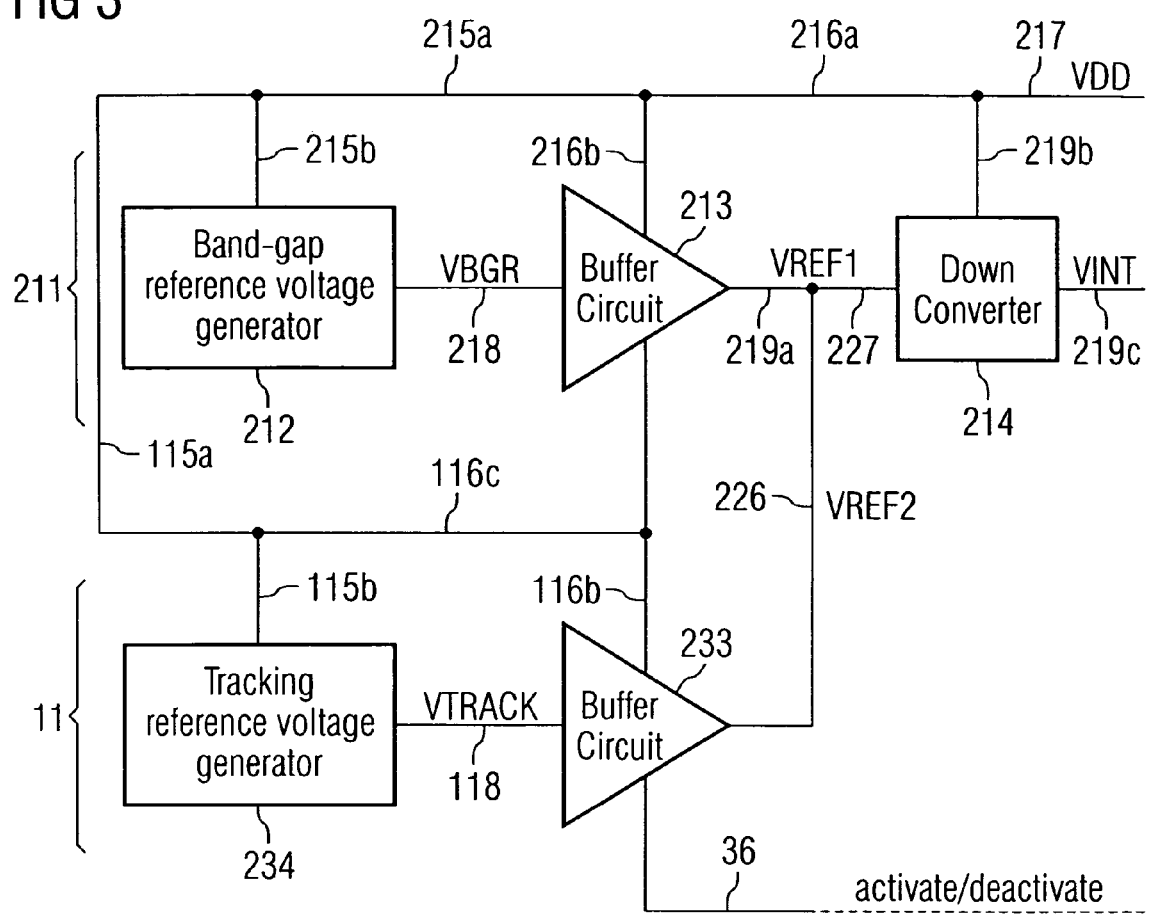
FIG. 3 a schematic representation of a voltage regulation system and—as a function of the CAS latency value—an activated, or deactivated high speed supplement device adapted to be connected to the voltage regulation system.

As a high speed supplement device 11, and/or 12, and/or 13, and/or 14, etc. there may, for instance, be used:

an appropriate duty cycle correction circuit (in particular e.g. identical or similar to the one described in IEEE Journal of Solid-State Circuits, vol. 36, pages 784-791, May 2001)), and/or appropriate special voltage regulation devices 223, 234 adapted to be connected to a conventional voltage regulation system, e.g. the voltage regulation system 211 illustrated in FIG. 3 (e.g. a buffer circuit 233 and a reference voltage generator 234 (as explained in detail by way of example in the following by means of FIGS. 3 to 7)), and/or appropriate special receiver circuits (or devices adapted to be connected to conventional receiver circuits and resulting in an improved receiver behavior), and/or appropriate special output driver circuits (or devices adapted to be connected to conventional output driver circuits and resulting in a higher slew rate in the activated state), etc., etc.

FIG. 3 shows a schematic representation of a conventional voltage regulation system 211 comprising a reference voltage generator 212 (e.g. a band-gap reference voltage generator), a buffer circuit 213, and a voltage regulator 214 (e.g. a down converter regulator).

As will be explained in more detail by way of example in the following, corresponding voltage regulation devices 233, 234 that have already been mentioned briefly above can be connected to the voltage regulation system 211—acting as high speed supplement device 11 (here: an additional buffer circuit 233 and a further reference voltage generator 234 (e.g. a voltage tracking reference voltage generator)).

As results from FIG. 3, the reference voltage generator 212 is supplied—e.g. via appropriate lines 215a, 215b, 216a, 217—with a supply voltage provided for the semiconductor memory device 1 by an external voltage supply.

The supply voltage has a—relatively high—voltage level VDD that is possibly subject to relatively strong fluctuations.

The intensity of the supply voltage may, for instance, range between 1.5 V and 2.5 V, e.g. approx. between 1.6 V and 2.0 V (1.8 V±0.2 V).

The reference voltage generator 212 generates a signal having a constant voltage level VBGR from the supply voltage—e.g. by means of one or a plurality of diodes.

The signal having the constant voltage level VBGR is—via an appropriate line 218—transmitted to the above-mentioned buffer circuit 213, is stored (buffered) there correspondingly, and is further propagated in the form of corresponding signals that also have a constant voltage level VREF1 (e.g.—via a line 219a—to the above-mentioned voltage regulator 214, and/or—e.g. via corresponding further, not illustrated lines—to further devices provided on the semiconductor device, e.g. further voltage regulators, etc.).

Figure 4:
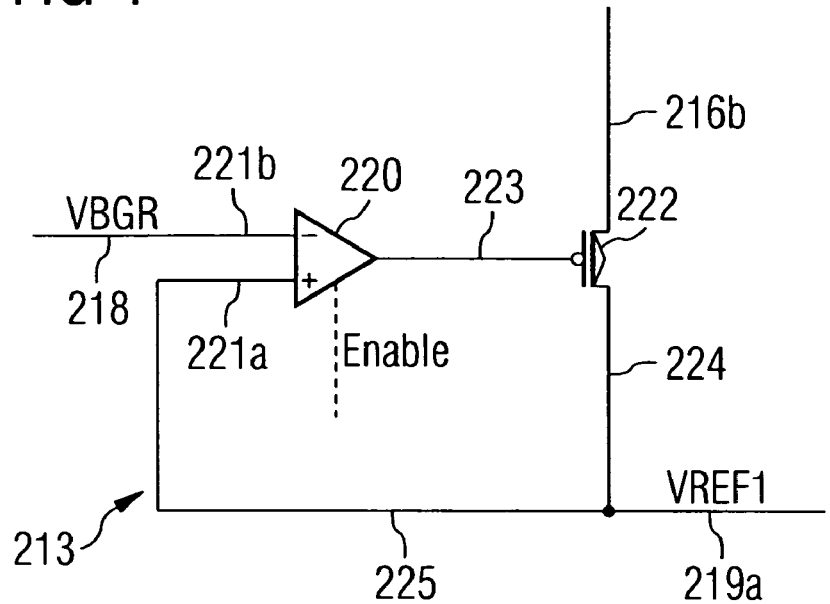
FIG. 4 a schematic detailed representation of a buffer circuit adapted to be used in the voltage regulation system illustrated in FIG. 3.

FIG. 4 shows a schematic detailed representation of a buffer circuit 213 adapted to be used in the voltage regulation system illustrated in FIG. 3.

The buffer circuit 213 comprises a differential amplifier 220 with a plus input 221a and a minus input 221b, and a field effect transistor 222 (here: a p-channel MOSFET).

One output of the differential amplifier 220 is connected with a gate pin of the field effect transistor 222 via a line 223.

As is further illustrated in FIG. 4, the source of the field effect transistor 222 is connected via a line 216b (which is—according to FIG. 3—connected to the above-mentioned lines 216a, 217) to the supply voltage having the above-mentioned relatively high voltage level VDD.

As results from FIG. 4, the above-mentioned signal supplied by the reference voltage generator 212 via the line 218 and having the above-mentioned, relatively constant voltage level VBGR is present at the minus input 221b of the differential amplifier 220.

The signal output at the drain of the field effect transistor 222 and having the above-mentioned, relatively constant voltage level VREF1 is fed back to the plus input 221a of the differential amplifier 220 via a line 224 and a line 225 connected therewith, and—via the line 219a connected with the line 224—propagated further to the above-mentioned voltage regulator 214 (and/or—e.g. via corresponding further, not illustrated lines—to the above-mentioned further voltage regulators, etc.).

Figure 5:
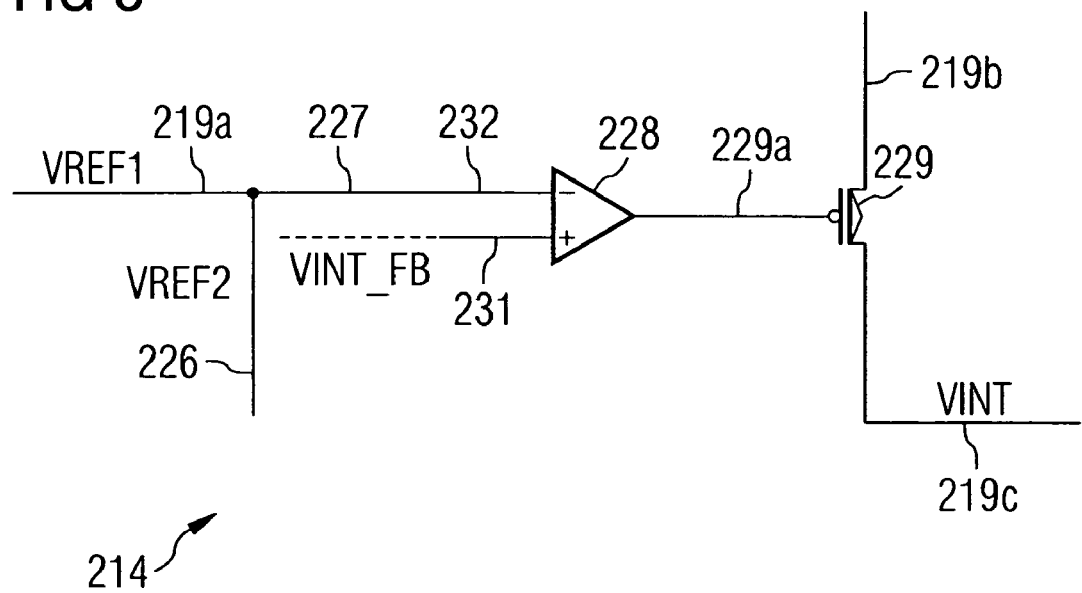
FIG. 5 a schematic detailed representation of a voltage regulator adapted to be used in the voltage regulation system illustrated in FIG. 3.

FIG. 5 shows a schematic detailed representation of a voltage regulator 214 to be used in the voltage regulation system 211 illustrated in FIG. 3.

The voltage regulator 214 comprises a differential amplifier 228 with a plus input 232 and a minus input 231, and a field effect transistor 229 (here: a p-channel MOSFET).

One output of the differential amplifier 228 is connected with a gate pin of the field effect transistor 229 via a line 229a.

As is further illustrated in FIG. 5, the source of the field effect transistor 229 is—via a line 219b (and—according to FIG. 3—the line 217 connected thereto)—connected to the supply voltage having the above-mentioned, relatively high voltage level VDD.

At the plus input 232 of the differential amplifier 228—as will be explained in more detail in the following—the (reference) signal supplied by the buffer circuit 213 via the line 219a and a line 227 connected therewith and having the above-mentioned, relatively constant voltage level VREF1 is present, and possibly additionally a (further) (reference) signal provided by the above-mentioned further buffer circuit 233—that is connected in parallel to the above-mentioned buffer circuit 213 (said signal has—as will be explained in more detail in the following—a variable voltage level VREF2 or a voltage level VREF2 that is possibly subject to corresponding fluctuations, respectively, and that is in general relatively high, and is, via a line 226 and the line 227 connected therewith, transmitted by the further buffer circuit 233 to the voltage regulator 214).

In a first embodiment of the voltage regulator 214, the voltage (VINT) output at the drain of the field effect transistor 229 is fed back directly to the differential amplifier 228; to this end, the drain of the field effect transistor 229 may be (directly) connected with the minus input 231 of the differential amplifier 228 via a line 219c (and a line connected therewith and not illustrated here) (the feedback voltage (VINT_FB) present at the minus input 231 of the differential amplifier 228 is then as great as the drain voltage (VINT)).

In a second, alternative embodiment, however, the voltage (VINT) output at the drain of the field effect transistor 229 is fed back to the differential amplifier 228 by interposing a voltage divider (not illustrated here), i.e. in a divided manner. To this end, the drain of the field effect transistor 229 may be connected via the line 219c (and a line connected therewith and not illustrated here) to a first resistor $R_2$ (not illustrated) of the voltage divider which is, on the one hand, connected with the ground (via a further voltage divider resistor $R_1$ (not illustrated, either) and, on the other hand, with the minus input 231 of the differential amplifier 228 (the feedback voltage (VINT_FB) present at the minus input 231 of the differential amplifier 228 is then by a particular factor smaller than the drain voltage (VINT)).

In the above-mentioned first embodiment of the voltage regulator (with direct feedback of the drain voltage (VINT)), the differential amplifier 228 regulates the voltage present at the gate pin of the field effect transistor 229 such that the (feedback) drain voltage (VINT) is as great as the reference voltage present at the plus input 232 of the differential amplifier 228 (i.e. VREF1 (if VREF1 is greater than VREF2), or VREF2 (if VREF2 is greater than VREF1) (cf. below)).

In contrast to that, in the case of the above-explained second, alternative embodiment of the voltage regulator 214—in which the drain voltage (VINT) is not fed back directly, but by means of the above-mentioned voltage divider—the voltage present at the gate pin of the field effect transistor 229 is regulated by the differential amplifier 228 such that there applies:

$$VINT = VREF \times (1 + (R_2/R_1))$$

(Or, more exactly, and as will be explained in more detail in the following: $VINT = VREF1 \times (1 + (R_2/R_1))$, if there applies: VREF1>VREF2, or $VINT = VREF2 \times (1 + (R_2/R_1))$, if there applies: VREF2>VREF1)

The voltage (VINT) output at the drain of the field effect transistor 229 (i.e. by the voltage regulator 214) at the line 219c constitutes the output voltage of the voltage regulation system 211.

By the above-mentioned regulation it is achieved that the output voltage (VINT) of the voltage regulation system 211 has—as is, for instance, illustrated in FIG. 6—, contrary to the supply voltage (VDD) which may partially be subject to relatively strong fluctuations, a constant size VINTnom—e.g. 1.5 V (but only if—as will be explained in more detail in the following—the (further) buffer circuit 233 or the above-mentioned high speed supplement device 11, respectively, is not activated (partially shown in dashed line in FIG. 6), or if—with an activated buffer circuit 233 or high speed supplement device 11, respectively—the supply voltage (VDD) is smaller than a predetermined threshold value (VDDnom) (as will also be explained in more detail in the following)).

The output voltage VINT present at the line 219c may—possibly via further, not illustrated lines—be transmitted as "internal supply voltage" to corresponding devices provided on the semiconductor device (said devices thus being adapted to be operated—in the case of a constant output voltage VINT having the above-mentioned voltage value VINTnom—with very high reliability and with a relatively small power loss and a relatively high lifetime).

If—in particular situations—the performance, in particular the switching rate of the devices connected (e.g. via the line 219c) to the output voltage VINT is to be increased—although the reliability and/or the lifetime of the devices operated with the output voltage VINT is possibly reduced thereby, and/or their power loss is increased—, the intensity of the output voltage VINT present at the line 219c, i.e. the intensity of the internal supply voltage, may be increased beyond the above-mentioned value ("nominal value" VINTnom) provided in normal operation and specified in the respective specification.

This (further, second) operating mode ("high performance operation") may, for instance, be used if the semiconductor device is to be used in high-end graphic systems, e.g. as a high end graphic memory device, e.g. as a memory device, in particular DRAM memory device, for a high clocked, in particular overclocked, processor, in particular graphic processor.

For normal operation—as has already been explained above—a CAS latency value CL can be stored in the CAS latency register 10 illustrated in FIG. 1, said CAS latency value CL being smaller than-equal to the above-mentioned high speed supplement device activate CAS latency threshold value $CL_{activate}$ (e.g. CL=2, 3, or 4), and for high performance operation—as has also been explained above already—a CAS latency value CL that is greater than the above-mentioned high speed supplement device activate CAS latency threshold value $CL_{activate}$ (e.g. CL=5).

In "normal operation", the above-mentioned further buffer circuit 233 or the high speed supplement device 11, respectively is—by the above-mentioned deactivate signal that is then applied to the control line 36 by the controller 2—correspondingly deactivated (or in a deactivated, current-saving state, or a state disconnected from the current supply, respectively).

Correspondingly, in "high performance operation", the above-mentioned further buffer circuit 233, or the high speed supplement device 11, respectively, is—by the above-mentioned activate signal that is then applied to the control line 36 by the controller 2—correspondingly activated (or taken to an activated state connected with the current supply and resulting in a correspondingly higher electric power consumption).

Figure 7:
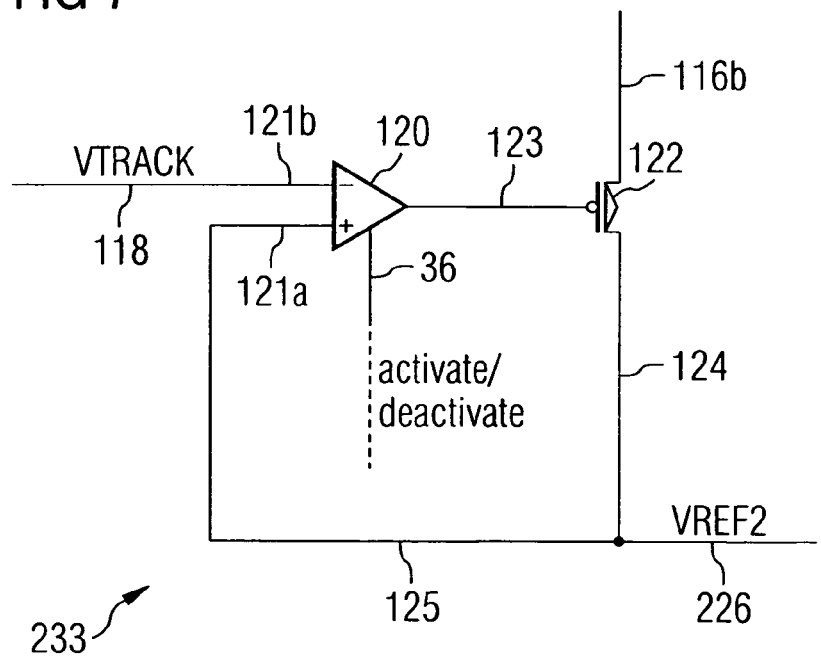
FIG. 7 a schematic detailed representation of a further, additional buffer circuit adapted to be used in the high speed supplement device adapted to be connected to the voltage regulation system, and illustrated in FIG. 3.

FIG. 7 shows a schematic detailed representation of a buffer circuit adapted to be used as further, additional buffer circuit 233 with the high speed supplement device 11 that is adapted to be connected to the voltage regulation system 211 (as has been explained, this buffer circuit connected to the controller 2 via the line 36).

The buffer circuit 233 comprises a differential amplifier 120 with a plus input 121a and a minus input 121b, and a field effect transistor 122 (here: a p-channel MOSFET).

One output of the differential amplifier 120 is connected via a line 123 with a gate pin of the field effect transistor 122.

As is further illustrated in FIG. 7, the source of the field effect transistor 122 is connected—via a line 116b (which—according to FIG. 3—is connected to the above-mentioned lines 215a, 216a, 217 via a line 116c and a line 115a)—to the supply voltage having the above-mentioned relatively high voltage level VDD.

As results from FIGS. 3 and 7, a signal having a variable voltage level VTRACK or a voltage level VTRACK with corresponding fluctuations, respectively (as will be explained in more detail in the following) and supplied by the reference voltage generator 234 via a line 118 is present at the minus input 121b of the differential amplifier 120.

The signal output at the drain of the field effect transistor 122 and having the above-mentioned—possibly variable—voltage level VREF2 is, via a line 124 and a line 125 connected therewith, fed back to the plus input 121a of the differential amplifier 120 and output at the line 226 that is connected with the line 124.

By means of the—further—buffer circuit 233—in an "activated" state of the buffer circuit 233 (in particular with an e.g. "logic high" activate signal present at the control line 36)—the above-mentioned signal that has a variable voltage level VTRACK and that is transmitted by the reference voltage generator 234 to the buffer circuit 233 via the line 118 is stored (buffered) and transmitted to the above-mentioned voltage regulator 214 in the form of corresponding signals having a voltage level VREF2 that corresponds to the voltage level VTRACK and being adapted to be tapped at the line 226 (and/or—e.g. via corresponding further, not illustrated lines—to the above-mentioned further voltage regulators, etc.).

In contrast to that, in the "deactivated" state of the buffer circuit 233—i.e. with a "logic low" deactivate signal present at the control line 36—its output (i.e. the drain of the field effect transistor 122 and thus the line 226) is in a highly resistive state.

As results from FIG. 3, the reference voltage generator 234 ("tracking reference voltage generator") is—via line 115b and the lines 115a, 215a, 216a, 217 connected therewith—connected to the above-mentioned supply voltage having the above-mentioned, relatively high voltage level VDD.

The (further) reference voltage generator 234 generates from the supply voltage having the voltage level VDD a voltage—which is transmitted to the buffer circuit 233 via the line 118—with a level VTRACK that may be higher than the level VBGR of the voltage VBGR generated by the (first) reference voltage generator 212 (which results in that the level VREF2 of the voltage transmitted by the (further) buffer circuit 233 via the line 226 to the voltage regulator 214 may be higher than the level VREF1 of the voltage transmitted by the (first) buffer circuit 213 via the line 219a to the voltage regulator 214).

The (further) reference voltage generator 234 may, for instance, generate, from the supply voltage having the voltage level VDD, a voltage that is transmitted to the buffer circuit 233 via the line 118 and that has a voltage level VTRACK which is proportional to the voltage level VDD of the supply voltage.

It is of advantage if (or it is the case with an alternative embodiment, respectively, that) the level VTRACK of the voltage generated by the (further) reference voltage generator 234 is substantially as great as or just somewhat smaller than the level VDD of the supply voltage (there may, for instance apply VTRACK=0.5 . . . 0.95×VDD, in particular 0.7 . . . 0.9×VDD, etc.).

The (further) reference voltage generator 234 may, for instance, be designed in the form of a voltage divider circuit comprising a plurality of resistors that are connected in series (wherein e.g. a first resistor may be connected to the supply voltage via the line 115b and a second resistor may be connected to the ground potential in series to the first resistor, wherein the voltage output by the (further) reference voltage generator 234 can be tapped between the two resistors and be transmitted to the buffer circuit 233 via the line 118).

The (further) reference voltage generator 234 (and the—first—reference voltage generator 212) is (or are) designed such that, if the supply voltage (VDD) is equal to the above-mentioned predetermined threshold value (VDD-nom), the level VTRACK of the voltage generated by the (further) reference voltage generator 234 is as great as the level VBGR of the voltage generated by the (first) reference voltage generator 212 (cf. also FIG. 6)—the level VREF1 of the voltage generated by the buffer circuit 213 is then identical to the level VREF2 of the voltage generated by the buffer circuit 233.

Figure 6:
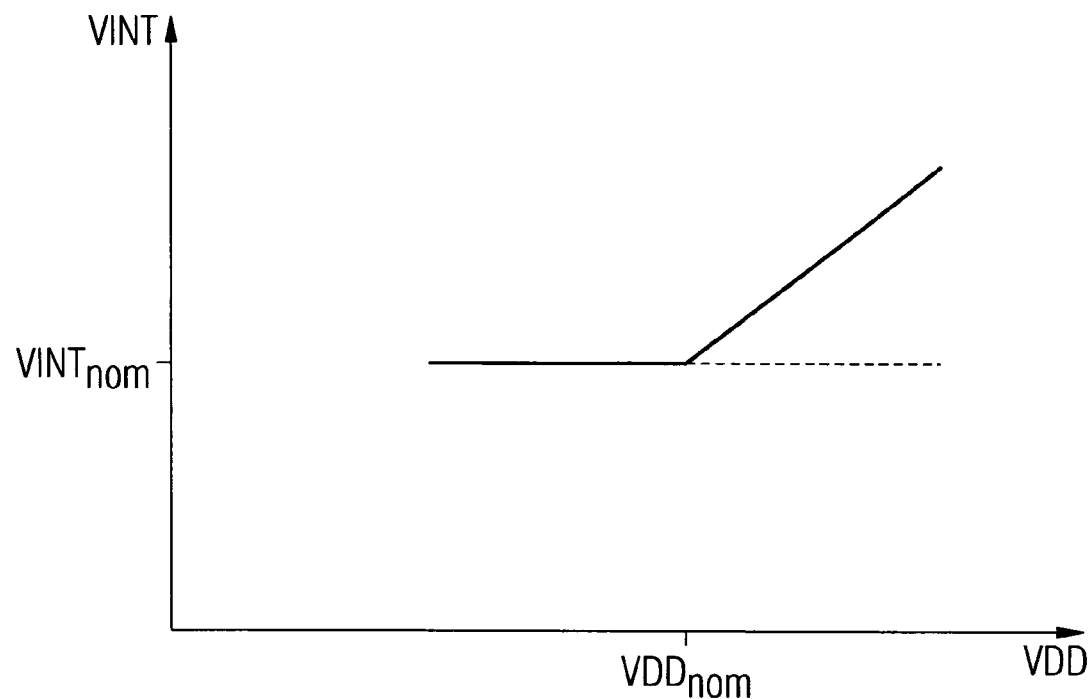
FIG. 6 a schematic representation of the intensity of the output voltage of the voltage regulation system illustrated in FIG. 3, as a function of the intensity of the supply voltage, in the activated and in the deactivated state of the high speed supplement device adapted to be connected to the voltage regulation system.

In the deactivated state of the (further) buffer circuit 233, the state of the signal input in the voltage regulator 214 at the line 227 (and thus also the state of the signal VINT output by the voltage regulator 214 at the line 219c) is (due to the then existing highly resistive state of the output of the buffer circuit 233, i.e. of the signal VREF2 present at the line 226) exclusively determined by the signal VREF1 that is present at the line 219a connected with the line 227, and that is output by the (first) buffer circuit 233 (as is illustrated—partially in dashed line—in FIG. 6, the level of the signal VINT output by the voltage regulator 214 is then—corresponding to the level of the signal VREF1—, irrespective of the present height of the level VDD of the supply voltage, constantly equally great (VINTnom)).

In contrast to that, in the activated state of the (further) buffer circuit 233, the state of the signal input in the voltage regulator 214 at the line 227 (and thus also the state of the signal VINT output by the voltage regulator 214 at the line 219c) is (due to the parallel connection of the two buffer circuits 213 and 233) determined by that one of the signals VREF1, VREF2—that are present at the lines 219a, 226 which are connected with each other and to the line 227—that, currently, has a higher level (this ensuring that—as is illustrated in FIG. 6 by means of the continuous line—the level of the signal VINT output by the voltage regulator 214 cannot drop below the norm or nominal level (VINTnom)).

LIST OF REFERENCE SIGNS

1. A method for operating a semiconductor memory device
2 controller
3a memory cell matrix
3b memory cell matrix
3c memory cell matrix
3d memory cell matrix
4 bus system
5 memory device controller
10 CAS latency register
11 high speed supplement device
12 high speed supplement device
13 high speed supplement device
14 high speed supplement device
36 control line
37 control line
38 control line
39 control line
115a line
115b line
116b line
116c line
118 line
120 differential amplifier
121a plus input
121b plus input
122 field effect transistor
123 line
124 line
125 line
211 voltage regulation system
212 reference voltage generator
213 buffer circuit
214 voltage regulator
215a line
215b line
216a line
216b line
217 line
218 line
219a line
219b line
219c line
220 differential amplifier
221a plus input
221b plus input
222 field effect transistor
223 line
224 line
225 line
226 line
227 line
228 differential amplifier
229 field effect transistor
229a line
231 minus input
232 plus input
233 buffer circuit
234 reference voltage generator
239 line

What is claimed is:

1. A method for operating a semiconductor memory device, comprising:
   reading out a data value defining a latency time and stored in a memory; and
   activating a high speed operation support device, provided on the semiconductor memory device, improving the performance of the semiconductor memory device each time that said data value stored in said memory is greater than a predetermined threshold value.

2. The method according to claim 1, wherein said memory is a latency time register, and said data value stored in the memory is a latency time data value.

3. The method according to claim 2, wherein said latency time register is a CAS latency time register, and said data value stored in said latency time register is a CAS latency time data value.

4. The method according to claim 1, wherein said device is activated if said data value, stored in said memory is greater than to a predetermined threshold value.

5. The method according to claim 1, wherein said device is deactivated if said data value stored in said memory is smaller than to a predetermined threshold value.

6. The method according to claim 1, wherein said device is activated if said data value stored in said memory is smaller than to a predetermined threshold value.

7. The method according to claim 1, wherein said device is deactivated if said data value stored in said memory is greater than to a predetermined threshold value.

8. The method according to claim 1, wherein said device is a duty cycle correction circuit.

9. The method according to claim 1, wherein said device is a voltage regulation circuit or part of a voltage regulation circuit.

10. The method according to claim 1, wherein said device is a receiver circuit or part of a receiver circuit.

11. The method according to claim 1, wherein said device is an output driver circuit or part of an output driver circuit.

12. A semiconductor memory device comprising:
   a memory for storing a data value defining a latency time; and
   a controller for activating a high speed operation support device, provided on said semiconductor memory device, improving the performance of the semiconductor memory device, each time that said data value stored in said memory is greater than a predetermined threshold value.

13. A system comprising:
   a semiconductor memory device;
   a memory for storing a data value; and
   a controller for activating high speed operation support device provided on said semiconductor memory device improving the performance of the semiconductor memory device, each time that said data value stored in said memory is greater than, or greater than-equal to a predetermined threshold value.

* * * * *

UNITED STATES PATENT AND TRADEMARK OFFICE
CERTIFICATE OF CORRECTION

PATENT NO. : 7,317,657 B2
APPLICATION NO. : 11/319754
DATED : January 8, 2008
INVENTOR(S) : Brox et al.

It is certified that error appears in the above-identified patent and that said Letters Patent is hereby corrected as shown below:

In Col. 13, line 11, delete "A method for operating a".

Signed and Sealed this

Sixth Day of May, 2008

JON W. DUDAS
*Director of the United States Patent and Trademark Office*